United States Patent [19]

Lee

[11] Patent Number: 5,780,325
[45] Date of Patent: Jul. 14, 1998

[54] METHODS OF MAKING ISOLATIONS INCLUDING DOPED EDGE LAYER, FOR SEMICONDUCTOR-ON-INSULATOR SUBSTRATES

[75] Inventor: Joon-hee Lee, Seoul, Rep. of Korea

[73] Assignee: Isoclear, Inc., Chicago, Ill.

[21] Appl. No.: 763,673

[22] Filed: Dec. 11, 1996

[30] Foreign Application Priority Data

Dec. 14, 1995 [KR] Rep. of Korea ............... 95-49689

[51] Int. Cl.$^6$ ............................................. H01L 21/00
[52] U.S. Cl. .................. 438/149; 438/149; 438/219; 438/404; 438/430; 438/435; 257/347; 257/507
[58] Field of Search .............................. 257/347, 507; 438/149, 219, 404, 430, 435, 155, 221, 227, 244

[56] References Cited

U.S. PATENT DOCUMENTS

| | | | |
|---|---|---|---|
| 5,264,395 | 11/1993 | Bindal et al. | 437/21 |
| 5,414,288 | 5/1995 | Fitch et al. | 257/328 |
| 5,610,083 | 3/1997 | Chan et al. | 437/21 |

*Primary Examiner*—John Niebling
*Assistant Examiner*—Long Pham
*Attorney, Agent, or Firm*—Lockwood, Alex, FitzGibbon & Cummings

[57] ABSTRACT

Isolation regions for a semiconductor layer of a semiconductor-on-insulator substrate are fabricated by forming a patterned implantation mask on the semiconductor layer. The patterned implantation mask includes mask sidewalls. An implantation masking film is formed on the sidewalls of the patterned implantation mask. Ions are implanted into the semiconductor layer, using the patterned implantation layer and the implantation masking film as a mask, to thereby form a doped region in the semiconductor layer. Sidewall spacers are formed on the implantation masking film, opposite the patterned implantation mask. The doped region between the sidewall spacers is etched to thereby define a trench in the semiconductor layer between the sidewall spacers and a doped edge layer in the semiconductor layer which extends from the trench to the implantation masking film. Insulating material is then formed in the trench.

14 Claims, 5 Drawing Sheets

METHODS OF MAKING ISOLATIONS INCLUDING DOPED EDGE LAYER, FOR SEMICONDUCTOR-ON-INSULATOR SUBSTRATES

FIELD OF THE INVENTION

This invention relates to semiconductor fabrication methods, and more particularly to methods of manufacturing semiconductor-on-insulator substrates.

BACKGROUND OF THE INVENTION

Semiconductor-on-insulator (SOI) substrates, also referred to as silicon-on-insulator substrates, are being used to fabricate microelectronic devices with a high integration density. As is well known to those having skill in the art, semiconductor-on-insulator substrates may be contrasted from bulk semiconductor substrates. In bulk semiconductor substrates, the active devices such as transistors are formed in the bulk semiconductor substrate. In contrast, in semiconductor-on-insulator substrates, active devices such as transistors are formed in a semiconductor layer which is separated from a substrate by a buried insulating layer.

In semiconductor-on-insulator substrates, it is important to isolate the active devices from one another. A common technique for device isolation is local oxidation of silicon, often referred to as LOCOS. Unfortunately, as the size of the active semiconductor devices is reduced to below submicron size, the LOCOS technique may be difficult to implement.

Another conventional isolation technique is a trench isolation technique, wherein a trench is formed in a semiconductor layer and then filled with an insulating material. Trench isolation techniques are capable of producing planarized surfaces, with good insulation characteristics.

The LOCOS technique may be especially inappropriate for semiconductor-on-insulator substrates. Accordingly, trench isolation techniques are especially useful for silicon-on-insulator substrates.

It is also known that an edge of an active device region, which is adjacent the device isolation region, may become inverted because of surface charges (charges between the active region and the device isolation region) and fixed charges within the device isolation region (sidewall inversion). Moreover, the leakage current in an active device such as a transistor may be increased by a parasitic transistor which may be formed in the edge of the active region. This is known as the edge transistor effect. In order to overcome these and other problems, it has been proposed to form a doped edge layer in the device isolation region, wherein the edge of the device isolating region is doped with dopants of the same conductivity type as the substrate active region, to thereby increase the doping concentration at the edge.

FIG. 1 is a cross-sectional view of a semiconductor-on-insulator substrate including a doped edge layer. The doped edge layer increases the doping concentration at the edge of the device isolation region.

As shown in FIG. 1, the semiconductor-oninsulator substrate includes a bulk substrate 100, a buried insulating layer 10 and a semiconductor layer 20 which forms the active device layer. A pad oxide film 30 and a patterned implantation mask 40 are included on the semiconductor layer 20. The semiconductor layer 20 is etched using the pad oxide 30 and the patterned implantation mask 40 as masks, to thereby form a trench 1. Ions 23 are implanted at an angle, into the sidewall of trench 1, to thereby form a doped edge layer 5 at the edge of the active region, on the sidewall of the trench 1. The doped edge layer 5 preferably has the same conductivity type as the semiconductor layer 20, and reduces or prevents sidewall inversion and edge transistor effects.

Unfortunately, as shown in FIG. 1, when the ions 23 are implanted at an angle, the pad oxide film 30 and the patterned implantation mask 40 may prevent implantation of ions 23 into the portion A at the interface between the pad oxide film 30 and the semiconductor layer 20. In order to completely implant ions into portion A, the implantation energy may be increased. Unfortunately, this may result in overimplantation in the remaining portions, so that the doped edge layer expands into the active region of the semiconductor layer. This may reduce the area of the active region and may reduce device integration density.

FIGS. 2A–2C illustrate another method which can form a device isolation region without overimplantation into the active semiconductor layer. As shown in FIG. 2A, a pad oxide layer 30 is formed on semiconductor layer 20. A patterned implantation mask 40 is formed on pad oxide film 30. Ions 50 are implanted into the semiconductor layer 20 using the patterned implantation mask 40 as a mask, thereby forming doped region 52. Thermal treatment is then performed so that the dopants in doped region 52 diffuse laterally, thereby forming a doped edge layer 54.

Then, referring to FIG. 2B, the semiconductor layer 20 is etched using the patterned implantation mask 40 as a mask, to form a trench 1. An insulating material is filled in the trench 1 to form a device isolating region 100 of FIG. 2C.

Accordingly, as shown in FIGS. 2A–2C, doped edge layer 5 can prevent sidewall inversion and edge transistor effects. Moreover, the doped edge layer 54 can be uniformly doped across the thickness thereof. Unfortunately, since the doped edge layer 54 is formed by diffusing dopants from the doped region 52, it may be difficult to control the doping concentration and lateral doping profile in doped edge layer 54.

It is known to solve these problems by using a method shown in FIGS. 3A–3D. Referring to FIG. 3A, a doped region 52 is formed as was already described in connection with FIG. 2A. Then, referring to FIG. 3B, an oxide film is formed, preferably by chemical vapor deposition (CVD) on the pad oxide layer 30 and on the patterned implantation mask 40. The oxide layer is then anisotropically etched to form sidewall spacers 60 on the sidewall of the patterned implantation mask 40, as shown in FIG. 3B. As shown in FIG. 3C, the pad oxide layer 30 and semiconductor layer 20 are etched, using the patterned implantation mask 40 and sidewall spacers 60 as a mask, to thereby form a trench and a doped edge layer 56. As shown in FIG. 3D, the trench is filled with an insulating material, to thereby form device isolation region 110.

Referring again to FIGS. 3A–3C, W1 indicates the width of the device isolation region which is initially defined. T4 indicates the width of the sidewall spacer 60. T5 indicates the width of the device isolation region which is finally defined. Accordingly, the width T5 of the device isolation region is obtained by subtracting the width T4 of the spacer 60 from the width W1 of the isolation region which is initially defined.

In the embodiment of FIGS. 3A–3D, the spacer 60 is formed on the sidewall of the patterned implantation mask 40 and is then used as a mask in etching the semiconductor layer 20, except for the doped edge layer 52. Thus, the width of the device isolating region 110 is reduced by twice the width T4 of the spacer 60. Moreover, since the doped edge layer 56 is not formed by diffusion, the doping concentration and profile in the doped edge layer can be controlled by controlling the doping concentration in doped region 52.

Notwithstanding the above-described improvements in device isolation methods, there continues to be a need to device isolation methods which can control the doping concentration and profile in doped edge layers while reducing the thickness of the doped edge layer, so that the active regions in the semiconductor layer can be enlarged.

SUMMARY OF THE INVENTION

It is therefore an object of the present invention to provide improved methods for fabricating isolation regions for semiconductor layers of semiconductor-on-insulator substrates.

It is another object of the present invention to provide device isolation region fabrication methods for semiconductor-on-insulator substrates which can control the doping concentration and doping profile in doped edge layers.

It is another object of the invention to provide isolation region fabrication methods for semiconductor-on-insulator substrates which can reduce the thickness of the edge impurity layer, to thereby enlarge the active device regions in the semiconductor layer.

These and other objects are provided, according to the present invention, by using an implantation masking film on the sidewalls of a patterned implantation mask, to reduce the thickness of a doped edge layer and thereby allow an increase in the size of the active device regions. The doped edge layer is formed by implantation, so that the doping concentration and profile can be well controlled.

In particular, methods of fabricating isolation regions for semiconductor layers of semiconductor-on-insulator substrates according to the present invention, form a patterned implantation mask on the semiconductor layer. The patterned implantation mask includes mask sidewalls. An implantation masking film is formed on the sidewalls of the patterned implantation mask. Ions are implanted into the semiconductor layer, using the patterned implantation layer and the implantation masking film as a mask, to thereby form a doped region in the semiconductor layer. Sidewall spacers are formed on the implantation masking film, opposite the patterned implantation mask. The doped region between the sidewall spacers is etched, to thereby define a trench in the semiconductor layer between the sidewall spacers, and a doped edge layer in the semiconductor layer which extends from the trench to the implantation masking film. Insulating material is then formed in the trench.

In embodiments of the present invention, a pad oxide film is formed on the semiconductor layer of a semiconductor-on-insulator substrate. A patterned implantation mask is formed on the pad oxide film. The patterned implantation mask includes mask sidewalls. An implantation masking film is formed on the patterned implantation mask opposite the semiconductor layer, on the sidewalls of the patterned implantation mask and on the pad oxide film between the sidewalls. Ions are implanted into the semiconductor layer, using the patterned implantation layer and the implantation masking film on the sidewalls of the patterned implantation mask as a mask, to thereby form a doped region in the semiconductor layer. A spacer layer is formed on the patterned implantation mask opposite the semiconductor layer, on the sidewalls of the patterned implantation mask and on the pad oxide film between the sidewalls. The spacer layer is anisotropically etched to produce sidewall spacers on the implantation masking film, opposite the patterned implantation mask. The doped region is then etched between the sidewall spacers, to thereby define a trench in the semiconductor layer between the sidewall spacers, and a doped edge layer in the semiconductor layer which extends from the trench to the implantation masking film. The trench is then filled with insulating material.

The trench may be filled with insulating material by forming an insulating material layer filling the trench and on the patterned implantation mask opposite the semiconductor layer. The insulating material layer is then etched to expose the patterned implantation mask. The patterned implantation mask is then removed. The patterned implantation mask may be removed by chemical mechanical polishing the insulating material layer to expose the patterned implantation mask.

The implantation masking film may be formed of silicon nitride and the patterned implantation mask may be formed with chemical vapor deposited silicon dioxide. Before filling the trench with insulating material, a protective oxide may be formed on the trench sidewalls.

Isolation region forming methods according to the present invention can form reduced thickness doped layers, so that the area for the active region in the semiconductor layer can be enlarged. Moreover, because the doped edge layer is formed by implantation into a doped region, the doping density and profile may be well controlled. Improved trench isolated semiconductor-on-insulator devices are thereby provided.

DETAILED DESCRIPTION OF PREFERRED EMBODIMENTS

Figure 1:
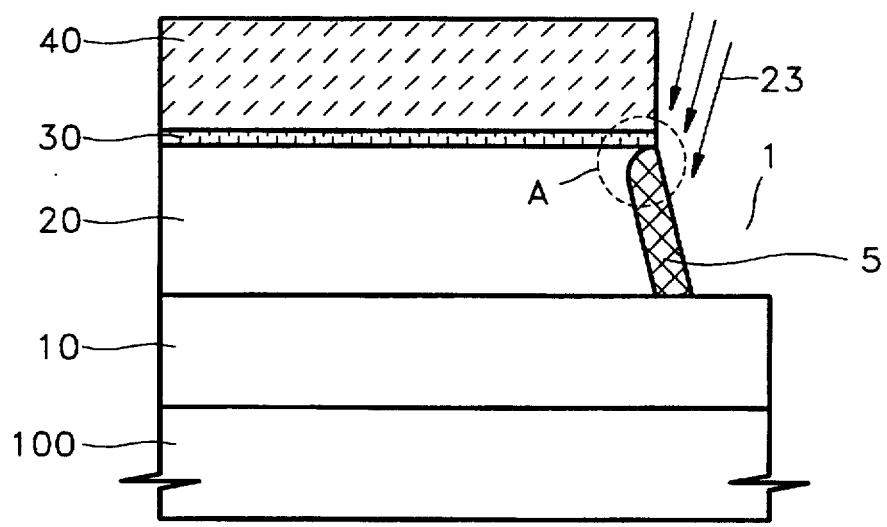
FIG. 1 is a cross-sectional view of a conventional trench isolated semiconductor-on-insulator device.
Figure 2A:
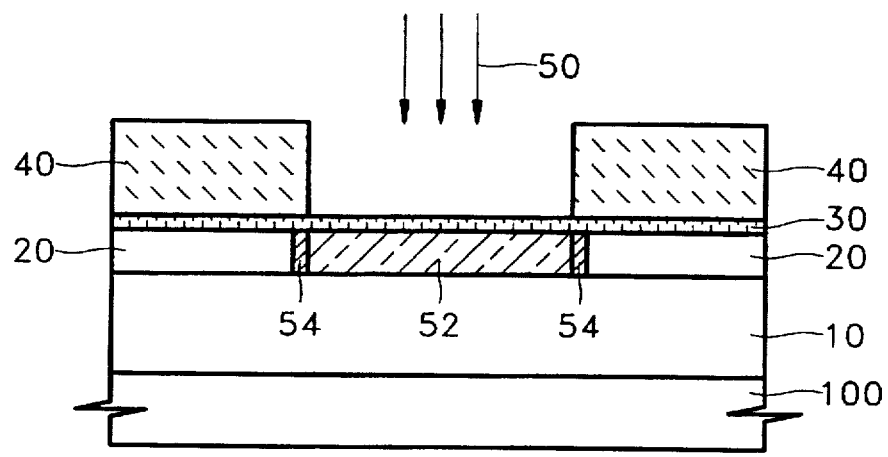
FIGS. 2A–2C are cross-sectional views of a conventional method of fabricating an isolation region for a semiconductor layer of a semiconductor-oninsulator substrate.
Figure 2B:
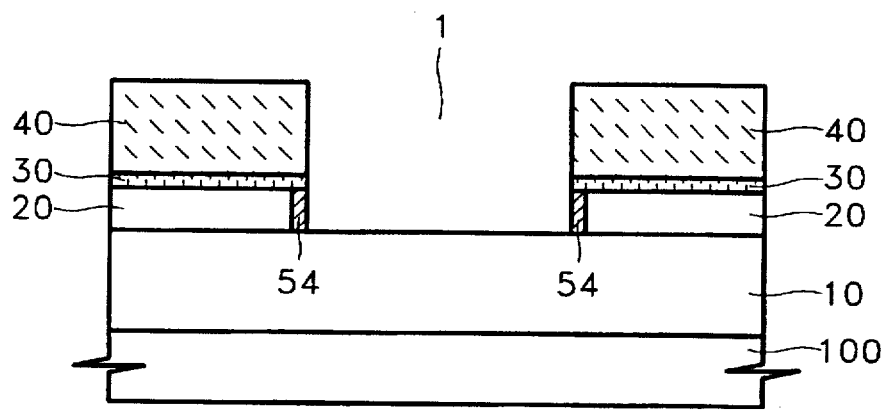
Figure 2C:
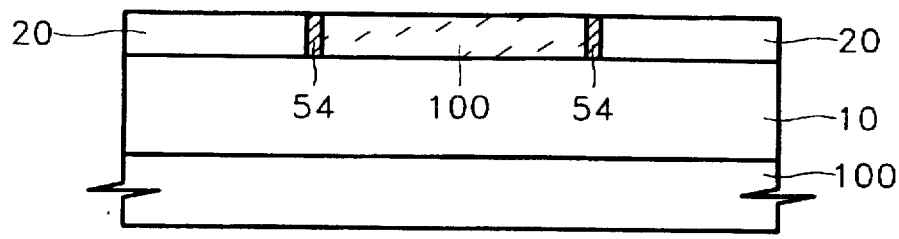

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity embodiment as well. It will also be understood that when a layer is referred to as being "on" another layer, it can be directly on the other layer, or intervening layers may also be present.

Figure 4A:
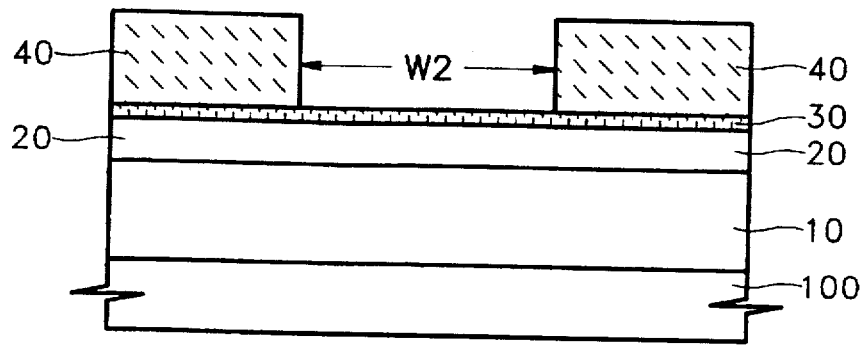
FIGS. 4A–4F are cross-sectional views of methods of fabricating isolation regions for semiconductor layers of semiconductor-on-insulator substrates according to the present invention, during intermediate fabrication steps.

FIGS. 4A–4F are cross-sectional illustrations of methods of fabricating isolation regions for semiconductor layers of semiconductor-on-insulator substrates according to the present invention. Referring now to FIG. 4A, a patterned implantation mask 40 is formed on a pad oxide film. In particular, a semiconductor-on-insulator substrate is provided having a bulk substrate 100, a buried insulating layer 10 on the bulk substrate 100 and a semiconductor layer 20 on the buried insulating layer 10. Pad oxide film 30 may be formed by thermally oxidizing the semiconductor layer 20. Patterned implantation mask 40 may be formed by depositing a material such as silicon nitride on the pad oxide 30 and then patterning the silicon nitride to form patterned implantation mask 40.

Patterned implantation mask 40 is preferably formed of a material which has an etch selectivity which is different from that of the pad oxide material for a given etching process. For example, silicon nitride is preferably used for the patterned implantation mask 40 and silicon dioxide is preferably used for the pad oxide film 30. As shown in FIG. 4A, W2 indicates the width of the device isolation region which is initially defined.

Figure 4B:
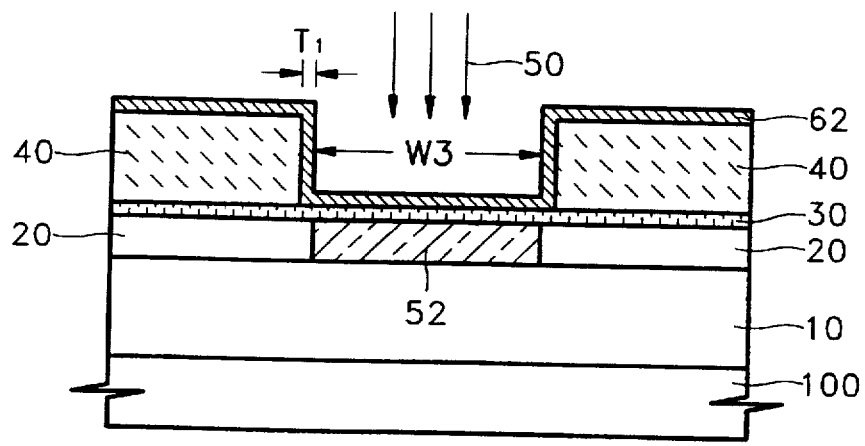

Referring now to FIG. 4B, an implantation masking film 62 is formed on the patterned implantation mask 40 opposite the semiconductor layer 20, on the sidewalls of the patterned implantation mask and on the pad oxide film 30 between the sidewalls. The implantation masking film 62 may be formed by chemical vapor deposition (CVD) of silicon dioxide on the substrate. As also shown in FIG. 4B, a doped region 52 in semiconductor layer 20 is formed by implanting ions 50 using the patterned implantation mask 40 and the implantation masking film 62 as a mask.

Figure 3A:
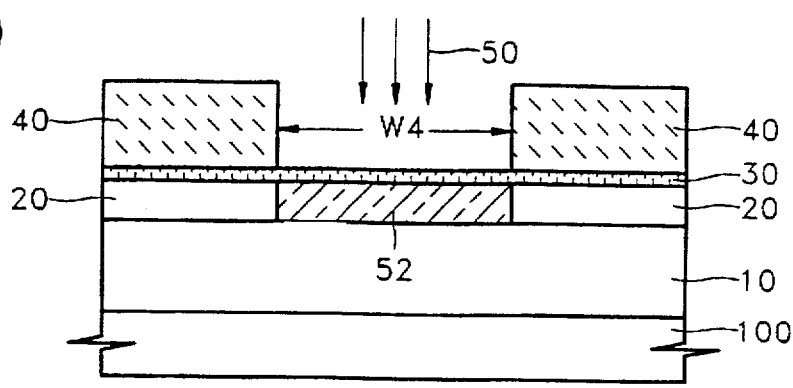
FIGS. 3A–3D are cross-sectional views of another conventional method of fabricating an isolation region for a semiconductor layer of a semiconductor-oninsulator substrate.
Figure 3B:
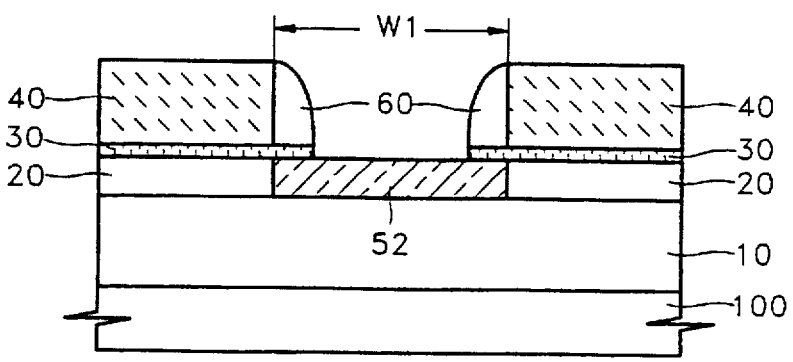

Still referring to FIG. 4B, the thickness of the implantation masking film is indicated as T1. Since the width W3 of the doped region 52 is smaller than the width W4 of FIG. 3A by an amount which is equal to twice T1, the active region side is enlarged by twice T1. It will be understood that the conductivity type of the dopants 50 which are implanted to form doped region 52 is preferably the same as the conductivity type of the semiconductor layer 20.

Figure 4C:
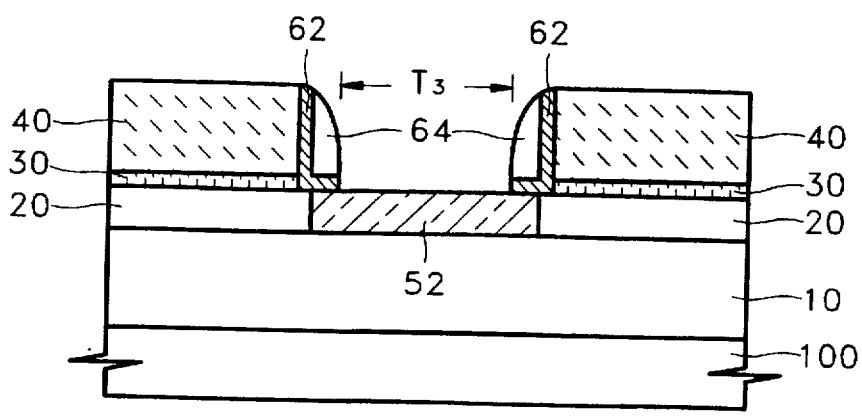

Referring now to FIG. 4C, sidewall spacers 64 are formed on the implantation masking film 62 opposite the patterned implantation mask 40. In particular, a spacer layer such as a silicon dioxide spacer layer, is blanket deposited using chemical vapor deposition. The spacer layer is formed on the patterned implantation mask 40 opposite the semiconductor layer 20, on the sidewalls of the patterned implantation mask and on the pad oxide film between the sidewalls. More specifically, when the implantation masking film 62 has been blanket deposited on the substrate, the spacer layer is formed on the implantation masking film which is on the patterned implantation mask opposite the semiconductor layer, on the implantation masking film which is on the sidewalls of the patterned implantation mask and on the implantation masking film which is on the pad oxide film between the sidewalls.

The spacer layer is then anisotropically etched to form the sidewall spacers 64. The implantation masking film 62 on the patterned implantation mask 40 opposite substrate 20 and on the pad oxide layer 30 opposite the doped region 52 is also removed during the anisotropic etching process.

Still referring to FIG. 4C, T3 denotes the width between the sidewall spacers. When the value obtained by adding the width of the spacers 64 to that of the thickness of implantation masking film 62 is the same as the width T4 of the spacers 60 of FIG. 3C, then the width T3 is the same as the width T5 of FIG. 3C. However, when the width of the spacer 64 of FIG. 4C is the same as the width T4 of the spacer 60 of FIG. 3C, T3 is less than T5 of FIG. 3C. Thus, the width T3 of the device isolation region which is produced by the present invention can be narrower than the width T5 of the device isolation region which is produced by conventional methods.

Figure 4D:
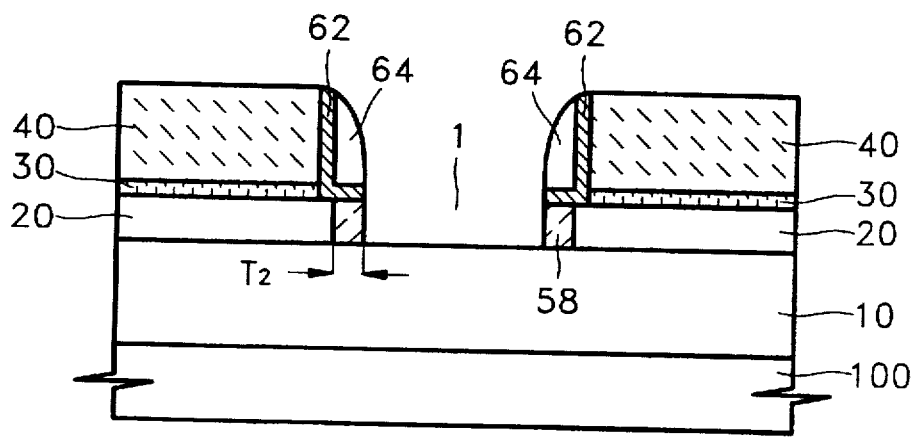

Referring now to FIG. 4D, doped edge layer 58 is formed by etching the doped region 52 between the sidewall spacers 64, to thereby define a trench 1 in the semiconductor layer 20 between the sidewall spacers 64 and to also define a doped edge layer 58 in the semiconductor layer which extends from the trench 1 to the implantation masking film 62 on the sidewall of patterned implantation mask 40. The sidewall spacers 64 are used as a mask. The buried insulating layer 10 acts as an etch stop.

As shown in FIG. 4D, the width T2 of the doped edge layer 58 is the same as the width of the spacer 64. Moreover, since the doped edge layer 58 according to the present invention is reduced in width by the thickness of the implantation masking film 62 on the sidewall of the patterned implantation mask 40, the width of the active region may be enlarged by twice the thickness of the implantation masking film 62.

Figure 4E:
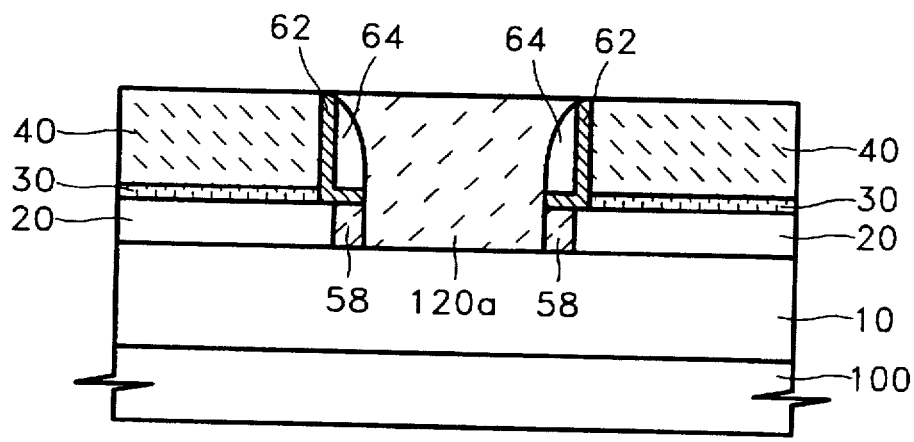

Referring now to FIG. 4E, the trench is filled with insulation material 120a. An insulating material layer is preferably formed, filling the trench and on the patterned implantation mask opposite the semiconductor layer. The insulating material layer is then etched to expose the patterned implantation mask 40, for example using chemical mechanical polishing (CMP).

In an alternate embodiment of the present invention, a thin oxide film, not illustrated in FIG. 4E, may be formed on the sidewalls of the trench 1 of FIG. 4D prior to forming the insulating material layer. The thin oxide film may be formed to remove the damage in the semiconductor layer 20 which results from the etch process which forms trench 1 of FIG. 4D.

Figure 4F:
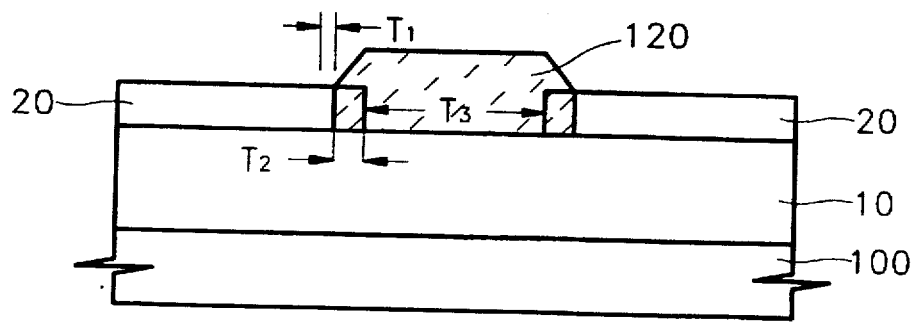

Finally, as shown in FIG. 4F, the patterned implantation mask 40 is removed and the pad oxide film 30 is also removed. Phosphoric acid may be used to etch the patterned implantation mask 40 and a buffered oxide etch (BOE) may be used to etch the pad oxide film 30.

Figure 3C:
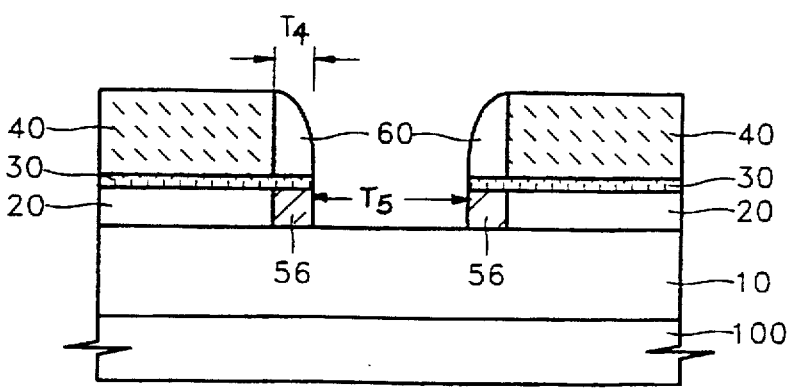
Figure 3D:
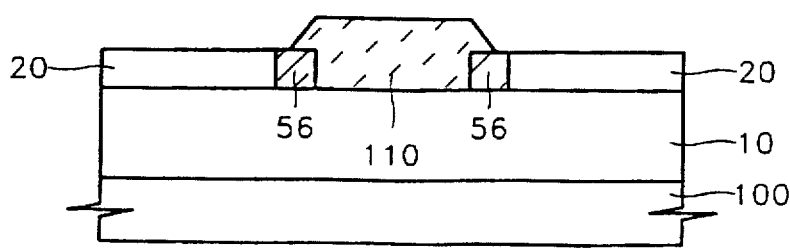

A comparison between the isolation regions which are formed according to the present invention (FIGS. 4A–4F) and those which are conventionally formed (FIGS. 3A–3D) will now be provided. If the width T4 of the spacer 60 of FIG. 3C is the same as the sum of the widths of the spacer 64 and the implantation masking film 62 of FIG. 4C, the width T3 of the device isolation region would be the same as the width T5 in FIG. 3C. Thus, the width T2 of the doped edge layer 58 according to the present invention becomes narrower than the width T4 in FIG. 3C by the width T1 of the implantation masking film 62. Moreover, if the width of the spacer 64 of FIG. 3C is the same as the width T4 of the spacer 60 in FIG. 3C, the width of the doped edge layer 58 of FIG. 4C becomes the same as that of the doped edge layer 56 of FIG. 3C. Thus, the width T3 of the device isolation region is narrower than the width T5 of FIG. 3C. In both cases, the active region of the semiconductor layer 2 is enlarged by an amount which is equal to twice the width of the implantation masking film 62, compared to that of the conventional method of FIGS. 3A–3D.

Accordingly, the present invention allows the thickness of the doped edge layer to be reduced. Moreover, the area of the device isolation region can be reduced. The area of the active region can also be enlarged.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an isolation region for a semiconductor layer of a semiconductor-on-insulator substrate, comprising the steps of:

forming an implantation mask on the semiconductor layer, the implantation mask having mask sidewalls;

forming an implantation masking film on the sidewalls of the implantation mask, to thereby define an opening between the implantation masking film on the sidewalls of the implantation mask;

implanting ions into the semiconductor layer, through the opening, to thereby form a doped region in the semiconductor layer;

forming sidewall spacers on the implantation masking film, opposite the patterned implantation mask;

etching a part of the doped region between the sidewall spacers to thereby define a trench in the semiconductor layer between the sidewall spacers, and a doped edge layer in the semiconductor layer which extends from the trench to the implantation masking film; and forming insulating material in the trench.

2. A method according to claim 1 wherein the step of forming an implantation mask on the semiconductor layer is preceded by the step of:

forming a pad oxide film on the semiconductor layer; and wherein the step of forming an implantation mask comprises the step of:

forming an implantation mask on the pad oxide film, the implantation mask including mask sidewalls.

3. A method according to claim 1 wherein the step of forming an implantation masking film comprises the step of:

forming an implantation masking film on the implantation mask opposite the semiconductor layer, on the sidewalls of the implantation mask and on the semiconductor layer between the sidewalls.

4. A method according to claim 1 wherein the step of forming sidewall spacers comprises the steps of:

forming a spacer layer on the implantation mask opposite the semiconductor layer, on the sidewalls of the implantation mask and on the semiconductor layer between the sidewalls; and anisotropically etching the spacer layer to produce the sidewall spacers on the implantation masking film, opposite the implantation mask.

5. A method according to claim 1 wherein the step of forming insulating material in the trench comprises the step of:

filling the trench with insulating material.

6. A method according to claim 5 wherein the step of filling the trench with insulating material comprises the steps of:

forming an insulating material layer filling the trench and on the implantation mask opposite the semiconductor layer;

etching the insulating material layer to expose the implantation mask; and removing the implantation mask.

7. A method according to claim 6 wherein the removing step comprises the step of:

chemical mechanical polishing the insulating material layer to expose the implantation mask.

8. A method of fabricating an isolation region for a semiconductor layer of a semiconductor-on-insulator substrate, comprising the steps of:

forming a pad oxide film on the semiconductor layer;

forming an implantation mask on the pad oxide film, the implantation mask having mask sidewalls;

forming an implantation masking film on the implantation mask opposite the semiconductor layer, on the sidewalls of the implantation mask and on the pad oxide film between the sidewalls, to define an opening between the implantation masking film on the sidewalls of the implantation mask;

implanting ions into the semiconductor layer, through the opening, to thereby form a doped region in the semiconductor layer;

forming a spacer layer on the implantation mask opposite the semiconductor layer, on the sidewalls of the implantation mask and on the pad oxide film between the sidewalls;

anisotropically etching the spacer layer to produce sidewall spacers on the implantation masking film, opposite the implantation mask;

etching a part of the doped region between the sidewall spacers to thereby define a trench in the semiconductor layer between the sidewall spacers, and a doped edge layer in the semiconductor layer which extends from the trench to the implantation masking film; and filling the trench with insulating material.

9. A method according to claim 5 wherein the step of filling the trench with insulating material comprises the steps of:

forming an insulating material layer filling the trench and on the implantation mask opposite the semiconductor layer;

etching the insulating material layer to expose the implantation mask; and removing the implantation mask.

10. A method according to claim 9 wherein the removing step comprises the step of:

chemical mechanical polishing the insulating material layer to expose the implantation mask.

11. A method according to claim 8 wherein the implantation masking film is formed of silicon nitride.

12. A method according to claim 8 wherein the implantation mask is formed of chemical vapor deposited oxide.

13. A method according to claim 8 wherein the etching step is followed by the step of:

forming an oxide on the trench sidewalls.

14. A method according to claim 8 wherein the step of forming a spacer layer comprises the step of:

forming a spacer layer on the implantation masking film which is on the implantation mask opposite the semiconductor layer, on the implantation masking film which is on the sidewalls of the implantation mask and on the implantation masking film which is on the pad oxide film between the sidewalls.

* * * * *

UNITED STATES PATENT AND TRADEMARK OFFICE
CERTIFICATE OF CORRECTION

PATENT NO. : 5,780,325
DATED : July 14, 1998
INVENTOR(S) : Joon-hee Lee

It is certified that error appears in the above-identified patent and that said Letters Patent is hereby corrected as shown below:

<u>On the Cover Page:</u>

[73] Assignee: Delete "Isoclear, Inc., Chicago, Ill." And substitute -- Samsung Electronics Co., Ltd., Suwon-city, Kyungki-do, Republic of Korea -- therefor.

Signed and Sealed this

Sixth Day of April, 1999

Attest:

Attesting Officer

Q. TODD DICKINSON

Acting Commissioner of Patents and Trademarks